United States Patent
Kim et al.

(10) Patent No.: US 11,119,377 B2
(45) Date of Patent: Sep. 14, 2021

(54) LCD PANEL AND EOA MODULE THEREOF

(71) Applicant: SHENZHEN ROYOLE TECHNOLOGIES CO., LTD., Guangdong (CN)

(72) Inventors: Ji Ha Kim, Guangdong (CN); Nana Xiong, Guangdong (CN); Dan Chen, Guangdong (CN)

(73) Assignee: SHENZHEN ROYOLE TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/766,964

(22) PCT Filed: Dec. 1, 2017

(86) PCT No.: PCT/CN2017/114287
§ 371 (c)(1),
(2) Date: May 26, 2020

(87) PCT Pub. No.: WO2019/104722
PCT Pub. Date: Jun. 6, 2019

(65) Prior Publication Data
US 2021/0033903 A1     Feb. 4, 2021

(51) Int. Cl.
*G02F 1/1368*     (2006.01)
*G09G 3/36*      (2006.01)
*H01L 27/12*     (2006.01)

(52) U.S. Cl.
CPC ......... *G02F 1/1368* (2013.01); *G09G 3/3677* (2013.01); *H01L 27/1214* (2013.01);
(Continued)

(58) Field of Classification Search
CPC ...... G02F 1/1368; G09G 3/3677; G09G 3/36; G09G 3/3648; G09G 2300/04;
(Continued)

(56) References Cited

U.S. PATENT DOCUMENTS

2016/0335974 A1    11/2016 Li et al.

FOREIGN PATENT DOCUMENTS

| CN | 104078017 A | 10/2014 |
| CN | 104637462 A | 5/2015 |

(Continued)

OTHER PUBLICATIONS

International Search Report issued in corresponding International Application No. PCT/CN2017/114287, dated Aug. 22, 2018, pp. 1-5, State Intellectual Property Office of the P.R. China, Beijing, China.

*Primary Examiner* — Joseph L Williams
*Assistant Examiner* — Jose M Diaz
(74) *Attorney, Agent, or Firm* — Hauptman Ham, LLP

(57) ABSTRACT

A liquid crystal display (LCD) panel and an emission D-IC on array (EOA) module (10') thereof are provided. The EOA module includes a high-level generating unit, a resetting unit, and a restoring unit. The high-level generating unit is configured to generate an output signal, where the output signal is at high level when a first clock signal (CLK) is at high level. The resetting unit is configured to reset the output signal from high level to low level when a second clock signal (CLKB) and a scan signal (Gn) of a current stage are simultaneously at high level. The restoring unit is configured to restore the output signal from low level to high level when a scan signal (Gn+1) of a subsequent stage is at high level.

19 Claims, 6 Drawing Sheets

(52) U.S. Cl.
CPC . *G09G 2300/04* (2013.01); *G09G 2310/0286* (2013.01); *G09G 2310/08* (2013.01)

(58) Field of Classification Search
CPC ........ G09G 2310/0286; G09G 2310/08; H01L 27/1214; G11C 19/28
See application file for complete search history.

(56) References Cited

FOREIGN PATENT DOCUMENTS

| | | |
|---|---|---|
| CN | 106611582 A | 5/2017 |
| CN | 106710549 A | 5/2017 |
| JP | 2015515642 A | 5/2015 |
| KR | 20170051792 A | 5/2017 |
| KR | 10-2017-0079769 A | 7/2017 |

LCD PANEL AND EOA MODULE THEREOF

RELATED APPLICATION

The present application is a U.S. National Phase of International Application Number PCT/CN2017/114287, filed Dec. 1, 2017.

TECHNICAL FIELD

This disclosure relates to the field of liquid crystal display, and more particularly to a liquid crystal display (LCD) panel and an emission D-IC on array (EOA) module thereof.

BACKGROUND

Since thin-film transistor liquid crystal displays (TFT-LCDs) are light, thin, and consume less power, TFT-LCDs are widely used in devices such as TVs, laptops, mobile phones, and the like.

An organic light emitting diode (OLED), as a current-type light-emitting device, has a self-luminescence function, can respond quickly, has a wide viewing angle, and is manufactured on a flexible substrate, and thus the OLED is widely used in the field of high-performance display. However, due to limitation of manufacturing process, electrical parameters of driving transistors of an OLED pixel such as a turn-on voltage and mobility often fluctuate. As a result, a current flowing through the OLED device varies with fluctuations of the turn-on voltage and the mobility of the driving transistors, resulting in uneven brightness of OLED pixels, thereby affecting display quality.

Generally, in order to realize high-stability, high-quality, and high-definition display effects, it is necessary to configure internal compensation for OLED pixel units. As an example, for an OLED pixel unit with internal compensation illustrated in FIG. 1A, there are four stages when driving the OLED: a reset stage, a compensation stage, a data-in stage, and an emission stage. Referring to FIG. 1B, in the reset stage, since an RST signal is at high level, a thin film transistor (TFT) T4 is switched on, and further a Vinitial signal is at low level, so no current signal flows through the OLED. In the compensation stage, a TFT T1 and a TFT T3 are switched on, but a Vref signal is at low level, so no current signal flows through the OLED. In the data-in stage, the TFT T1 is switched on, and a Vdata signal is at high level, a capacitor C1 starts to be charged, and there is still no current signal flowing through the OLED. In the emission stage, the TFT T3 and a TFT T2 are switched on (the capacitor C1 has been charged), and thus at this time, a current signal begins to flow through the OLED, and therefore, the OLED starts to emit lights. In the OLED pixel unit, a light-emitting signal En for driving the TFT T3 is provided by an emission D-IC on array (EOA) module. The light-emitting signal En is at low level only during the data-in stage while being at high level during other stages. That is, in the data-in stage, the EOA module is switched off, and a data signal output by a driver integrated circuit (IC) flows into the capacitor C1 through the TFT T1, thereby realizing input of the data signal. The data signal is used to control brightness of the pixel. In addition, a scan signal Gn for driving the TFT T1 is provided by a gate D-IC on array (GOA) module.

Referring to circuit diagrams of an existing EOA module illustrated in FIG. 2A and an existing EOA module illustrated in FIG. 2B, the EOA module includes a high-level generating unit and a resetting unit. When a start pulse signal (STV) and a second clock signal (GCLK) are simultaneously at high level, a signal (Rout n) output through an output of the resetting unit is at high level, and the output signal is restored to low level in a subsequent stage. When a first clock signal (ECLK n) is at high level and the output signal (Rout n) of the resetting unit is at low level, the high-level generating unit makes a signal (EMS-out n, En for short) output through an output of the EOA module to be at high level. When the output signal (Rout n) of the resetting unit is at high level, the signal output through the output of the EOA module is reset from high level to low level. In this way, the EOA module only outputs a low-level signal during the data-in stage and outputs a high-level signal during the other three stages.

However, when constructing the above EOA module, the STV signal provided by a driver IC needs to be introduced, which increases, on the one hand, the burden on the driver IC. On the other hand, the driver IC is disposed on a driver board while the EOA module is disposed on an LCD substrate, that is, a distance between the driver board and the LCD substrate is relatively large, a transmission line for transmitting the STV signal needs to be set relatively long. The STV signal has jitter due to high attenuation, which affects the output signal of the EOA module.

In addition, when the LCD panel is laid out, as illustrated in FIG. 3, an EOA module 10 and a GOA module 20 are disposed in a boundary area of the LCD substrate, and a middle area of the LCD substrate is a display area (i.e., an OLED pixel unit area). The existing EOA module 10 includes a part 101 and a part 102. Referring to FIG. 2A and FIG. 2B, the EOA module includes a relatively large number of devices and has a complicated structure. As such, the boundary area occupied by the EOA module is relatively large. Accordingly, a size of the display area is relatively small. However, a size of a border is an important index in screen products.

SUMMARY

The technical problem to be solved by the disclosure is that the existing EOA module needs to introduce an STV signal.

Technical solution is as follows.

The technical solution adopted by the disclosure to solve the technical problem is as follows. An EOA module is constructed, where the EOA module includes a high-level generating unit, a resetting unit, and a restoring unit. The high-level generating unit is configured to generate an output signal according to a first clock signal, where the output signal is at high level when the first clock signal is at high level. The resetting unit is configured to reset, according to a second clock signal and a scan signal of a current stage, the output signal from high level to low level when the second clock signal and the scan signal of the current stage are simultaneously at high level, where the second clock signal has a frequency twice a frequency of the first clock signal. The restoring unit is configured to restore, according to a scan signal of a subsequent stage, the output signal from low level to high level when the scan signal of the subsequent stage is at high level.

In one implementation, the high-level generating unit includes a first N-type thin film transistor (TFT), a second N-type TFT, and a capacitor. A gate and a drain of the first TFT are both coupled with a transmission line for transmitting the first clock signal. A source of the first TFT is coupled with a gate of the second TFT. A drain of the second TFT is coupled with a transmission line for transmitting a high-level signal. A source of the second TFT is an output of the EOA module. The capacitor is coupled between the gate of the second TFT and the source of the second TFT.

In one implementation, the high-level generating unit further includes a third N-type TFT T13. A drain of the third TFT is coupled with a transmission line for transmitting a high-level signal. A gate of the third TFT is coupled with the source of the second TFT. A source of the third TFT is coupled with the gate of the second TFT.

In one implementation, the resetting unit includes a fourth N-type TFT, a fifth N-type TFT, and a sixth N-type TFT. A gate of the fourth TFT is coupled with a transmission line for transmitting the scan signal of the current stage. A drain of the fourth TFT is coupled with a transmission line for transmitting the second clock signal. A source of the fourth TFT is coupled with a gate of the fifth TFT and a gate of the sixth TFT. A source of the fifth TFT and a source of the sixth TFT are coupled with a transmission line for transmitting a low-level signal. A drain of the fifth TFT is coupled with the source of the second TFT. A drain of the sixth TFT is coupled with the source of the first TFT.

In one implementation, the restoring unit includes a seventh N-type TFT. A gate of the seventh TFT is coupled with a transmission line for transmitting the scan signal of the subsequent stage. A drain of the seventh TFT is coupled with the source of the fourth TFT. A source of the seventh TFT is coupled with the transmission line for transmitting the low-level signal.

In one implementation, the first TFT, the second TFT, and the third TFT are switched on when the first clock signal is at high level.

In one implementation, the fourth TFT, the fifth TFT, and the sixth TFT are switched on when the second clock signal is at high level.

In one implementation, the second TFT is switched off after the sixth TFT is switched on.

According to the disclosure, a liquid crystal display (LCD) panel is further constructed. The LCD panel includes an EOA module disposed in a boundary area of the LCD panel. The EOA module is the above EOA module.

In one implementation, the LCD panel further includes a gate D-IC on array (GOA) module. The EOA module is electrically coupled with the GOA module. The EOA module and the GOA module are both disposed in the boundary area of the LCD panel.

Advantageous effects: by adopting the technical solution of the disclosure, the EOA module can generate a low-level signal according to a scan signal output by the GOA module without introducing an STV signal from a driver IC. In this way, the burden on the driver IC can be reduced. In addition, because the GOA module and the EOA module are both disposed on the LCD panel, a distance between the GOA module and the EOA module is much smaller than a distance between the EOA module and the driver IC, so that attenuation of the scan signal is relatively low, and therefore, a situation where an output signal of the EOA module is affected by jitter of the scan signal can be avoided.

BRIEF DESCRIPTION OF THE DRAWINGS

To illustrate the technical solutions in the implementations of the disclosure more clearly, a brief introduction on accompanying drawings which are needed in the description of the implementations is given below. Apparently, the accompanying drawings in the description below are merely some of the implementations of the disclosure, based on which other drawings can be acquired by persons of ordinary skill in the art without any creative effort.

DETAILED DESCRIPTION

Hereinafter, technical solutions embodied by the implementations of the disclosure will be described in a clear and comprehensive manner with reference to the accompanying drawings intended for the implementations. It is evident that the implementations described herein constitute merely some rather than all the implementations of the disclosure, and that those of ordinary skill in the art will be able to derive other implementations based on these implementations without making creative efforts, which all such derived implementations shall all fall in the protection scope of the disclosure.

Figure 1A:
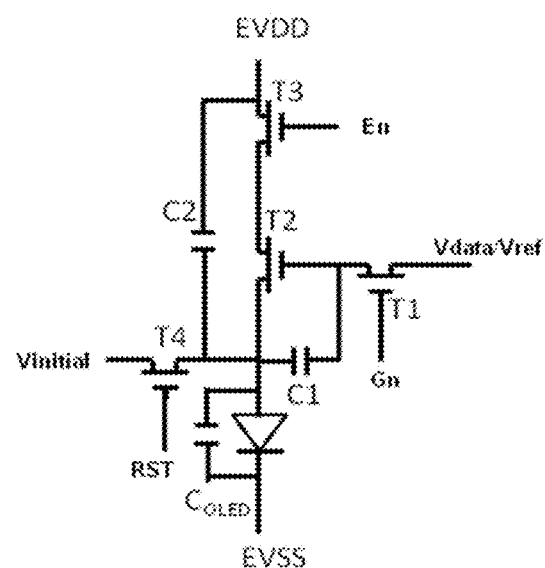
FIG. 1A is a circuit diagram illustrating an OLED pixel unit with an internal compensation.
Figure 1B:
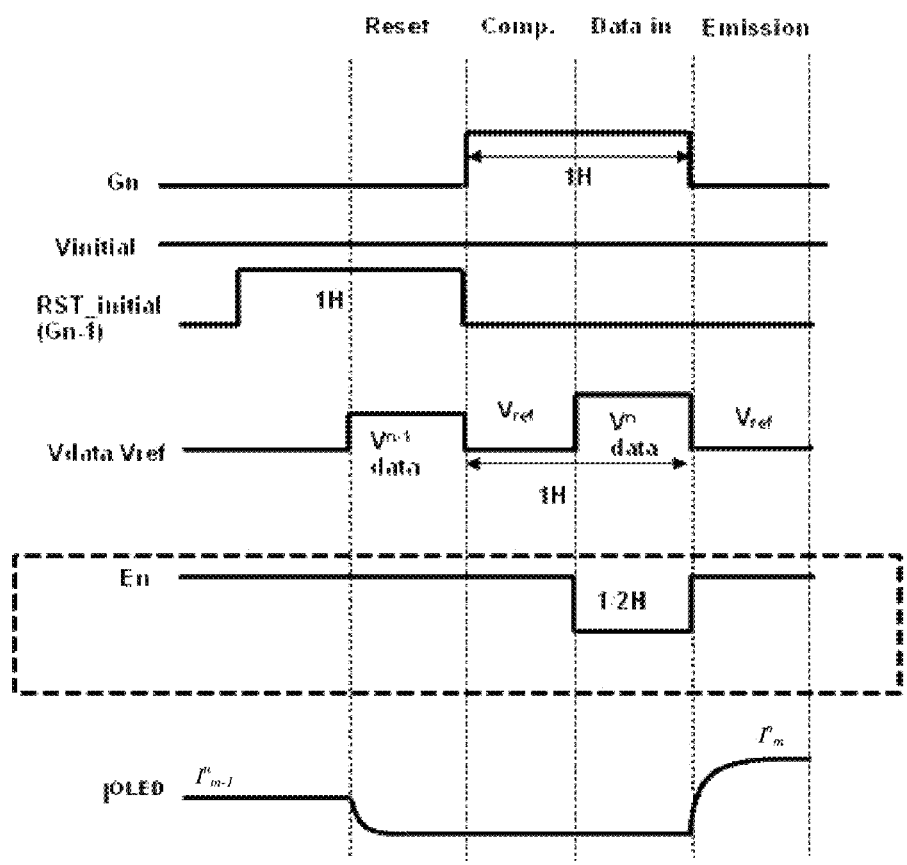
FIG. 1B illustrates timing diagrams of various signals illustrated in FIG. 1A.
Figure 2A:
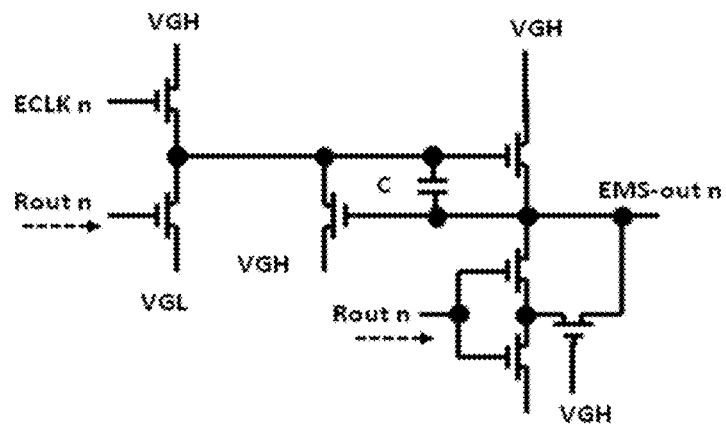
FIG. 2A is a circuit diagram illustrating a first part of an existing EOA module.
Figure 2B:
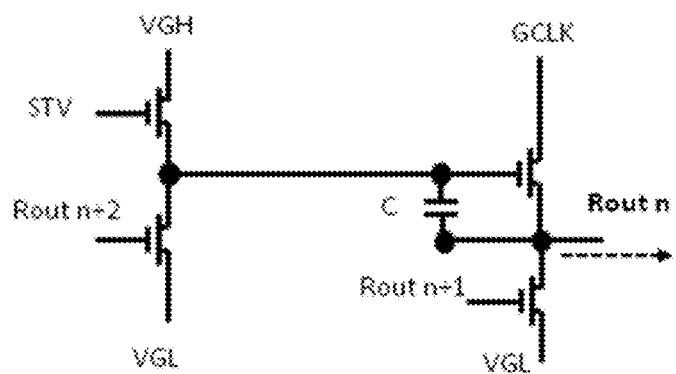
FIG. 2B is a circuit diagram illustrating a second part of an existing EOA module.
Figure 3:
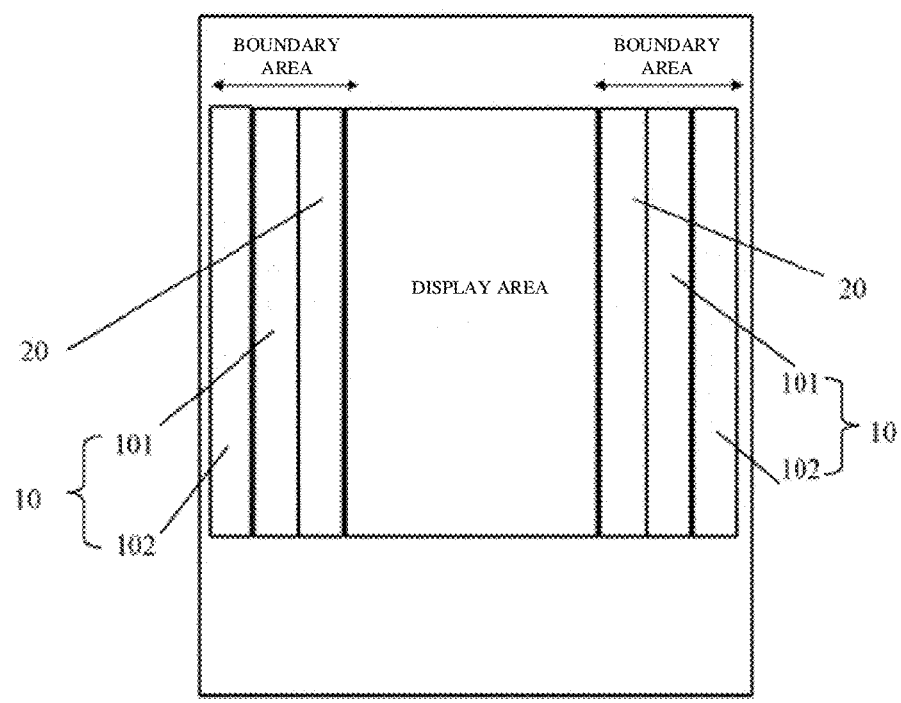
FIG. 3 is a schematic structural diagram illustrating an existing liquid crystal display panel.
Figure 4:
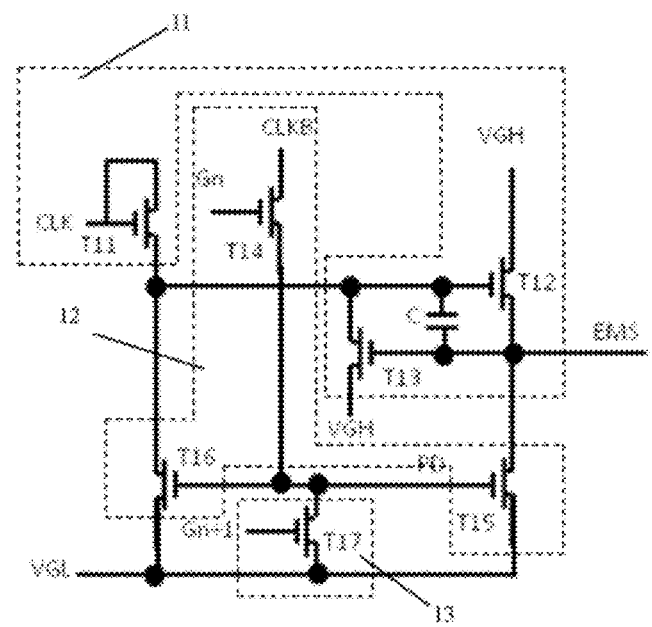
FIG. 4 is a circuit diagram illustrating an EOA module according to a first implementation.

FIG. 4 is a circuit diagram illustrating an emission D-IC on array (EOA) module according to a first implementation. The EOA module of this implementation includes a high-level generating unit 11, a resetting unit 12, and a restoring unit 13. The high-level generating unit 11 is configured to generate an output signal according to a first clock signal (CLK), where the output signal is at high level when the first clock signal is at high level. The resetting unit 12 is configured to reset, according to a second clock signal (CLKB) and a scan signal (Gn) of a current stage, the output signal from high level to low level when the second clock signal and the scan signal of the current stage are simultaneously at high level, where the second clock signal has a frequency twice a frequency of the first clock signal. The restoring unit 13 is configured to restore, according to a scan signal (Gn+1) of a subsequent stage, the output signal from low level to high level when the scan signal of the subsequent stage is at high level. In addition, it should be noted that the first clock signal (CLK) and the second clock signal (CLKB) are both output by a driver IC, and the scan signals are output by a gate D-IC on array (GOA) module.

According to the EOA module of this implementation, firstly, the high-level generating unit 11 generates the output signal according to the first clock signal, where the output signal is at high level when the first clock signal is active level (i.e., at high level). Secondly, the resetting unit 12 resets the output signal from high level to low level when the second clock signal and the scan signal of the current stage are active level (i.e., at high level) simultaneously. Finally, the restoring unit 13 restores the output signal from low level to high level when the scan signal of the subsequent stage is active level (i.e., at high level). In this way, the EOA module outputs a low-level signal only during a data-in stage while outputting a high-level signal during other three stages (i.e., a reset stage, a compensation stage, and an emission stage). Moreover, since the EOA module generates the low-level signal according to the scan signal output by the GOA module, an STV signal from a driver IC does not need to be introduced, thereby reducing the burden on the driver IC. In addition, because the GOA module and the EOA module are both disposed on the LCD panel, a distance between the GOA module and the EOA module is much smaller than a distance between the EOA module and the driver IC, so that attenuation of the scan signal is relatively low, and therefore, a situation where an output signal of the EOA module is affected by jitter of the scan signal can be avoided.

In this implementation, the high-level generating unit 11 includes a first N-type thin film transistor (TFT) T11, a second N-type TFT T12, a third N-type TFT T13, and a capacitor C. The capacitor C is a capacitor of picofarad (pF) level. A gate and a drain of the first TFT T11 are both coupled with a transmission line for transmitting the first clock signal (CLK). A source of the first TFT T11 is coupled with a gate of the second TFT T12. A drain of the second TFT T12 is coupled with a transmission line for transmitting a high-level signal (VGH). A source of the second TFT T12 is an output of the EOA module, that is, the source of the second TFT T12 outputs an emitting signal (EMS). The capacitor is coupled between the gate of the second TFT T12 and the source of the second TFT T12. A drain of the third TFT T13 is coupled with a transmission line for transmitting a high-level signal (VGH). A gate of the third TFT T13 is coupled with the source of the second TFT T12. A source of the third TFT T13 is coupled with the gate of the second TFT T12. When the first clock signal (CLK) is at high level, the first TFT T11, the second TFT T12, and the third TFT T13 are sequentially switched on. In other implementations, the third TFT T13 can also be omitted.

In this implementation, the resetting unit 12 includes a fourth N-type TFT T14, a fifth N-type TFT T15, and a sixth N-type TFT T16. A gate of the fourth TFT T14 is coupled with a transmission line for transmitting the scan signal (Gn) of the current stage. A drain of the fourth TFT T14 is coupled with a transmission line for transmitting the second clock signal (CLKB). A source of the fourth TFT T14 is coupled with a gate of the fifth TFT T15 and a gate of the sixth TFT T16. A source of the fifth TFT T15 and a source of the sixth TFT T16 are coupled with a transmission line for transmitting a low-level signal (VGL). A drain of the fifth TFT T15 is coupled with the source of the second TFT T12. A drain of the sixth TFT T16 is coupled with the source of the first TFT T11. When the second clock signal (CLKB) is at high level, the fourth TFT T14, the fifth TFT T15, and the sixth TFT T16 are switched on. After the sixth TFT T16 is switched on, the second TFT T12 is switched off.

In this implementation, the restoring unit includes a seventh N-type TFT T17. A gate of the seventh TFT T17 is coupled with a transmission line for transmitting the scan signal (Gn+1) of the subsequent stage. A drain of the seventh TFT T17 is coupled with the source of the fourth TFT T14. A source of the seventh TFT T17 is coupled with the transmission line for transmitting the low-level signal.

Figure 5:
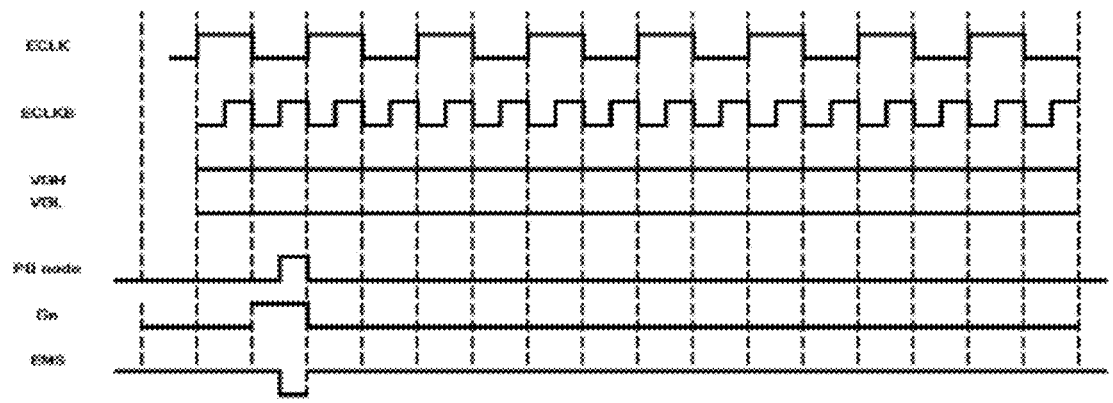
FIG. 5 illustrates timing diagrams of various signals illustrated in FIG. 4 according to some implementations.

The work principle of the EOA module of this implementation is described below with reference to timing diagrams illustrated in FIG. 5. In a high-level output mode, when the first clock signal (CLK) is at high level, the first TFT T11 is switched on, and accordingly the second TFT T12 and the third TFT T13 are switched on. At this time, an EMS signal output by the EOA module is at high level. Then, enter a resetting mode, the scan signal (Gn) is initially at high level, and the fourth TFT T14 is switched on, and furthermore, a PD node jumps to be at high level when the second clock signal (CLKB) is at high level, and thus the fifth TFT T15 and the sixth TFT T16 are switched on. The EMS signal output by the EOA module is pulled down to be a low-level signal due to that the fifth TFT T15 is switched on. At the same time, since the sixth TFT T16 is switched on, the second TFT T12 is accordingly switched off. Finally, enter a restoring mode, and when the scan signal (Gn+1) of the subsequent stage is at high level, the seventh TFT T17 is switched on, and accordingly the PD node is pulled down to be at low level. At the same time, the fifth TFT T15 is switched off, and the EMS signal output by the EOA module is reset to be a high-level signal.

Compared with the existing EOA module, the EOA module of this implementation has a reduced number of TFTs and a simpler structure. In this case, not only an area occupied by the EOA module is reduced, but also the yield of production process of the EOA module can be improved.

Figure 6:
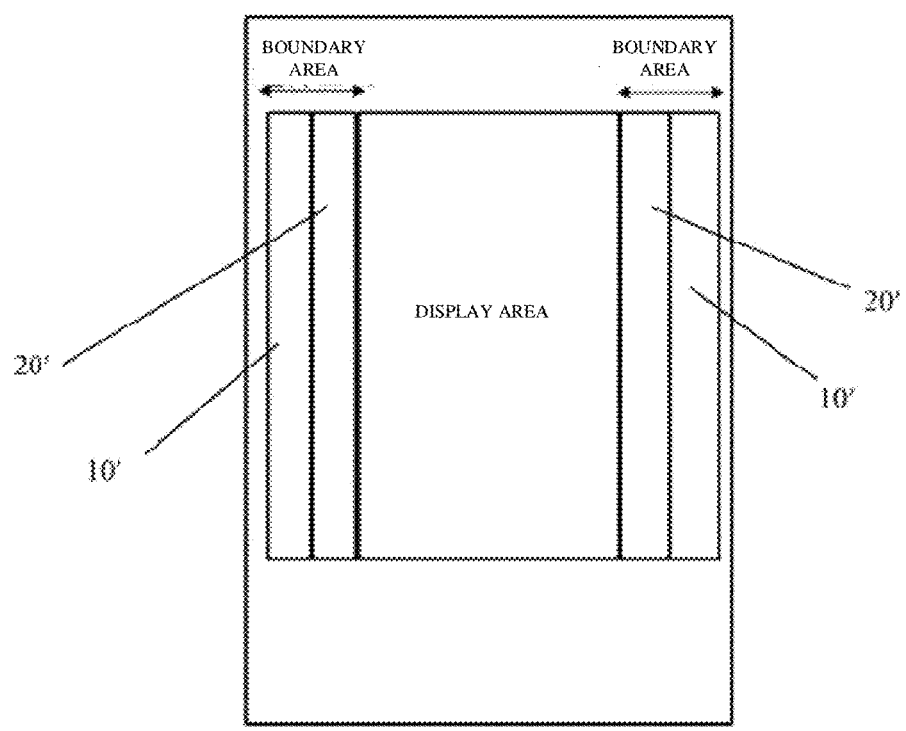
FIG. 6 is a schematic structural diagram illustrating a liquid crystal display panel according to some implementations.

According to the disclosure, a liquid crystal display (LCD) panel is further constructed. The LCD panel includes an EOA module and a GOA module disposed in a boundary area of the LCD panel. The EOA module is electrically coupled with the GOA module. For details of a circuit structure of the EOA module, reference can made to the related descriptions in the foregoing implementations, which will not be described in further detail herein. Furthermore, when the LCD panel is laid out, as illustrated in FIG. 6, an EOA module 10' and a GOA module 20' are both disposed in the boundary area of the LCD panel. Compared with the related art, the EOA module 10' occupies a relatively small area due to the reduction in the number of devices of the EOA module 10', and accordingly, the required size of the boundary area of the LCD panel can be reduced.

The foregoing description merely depicts some exemplary implementations of the disclosure, which however are not intended to limit the disclosure. Any modifications, equivalent substitutions, or improvements made thereto without departing from the spirits and principles of the disclosure shall all be encompassed within the protection of the disclosure

What is claimed is:

1. An emission D-IC on array (EOA) module, comprising:
   a high-level generating unit configured to generate an output signal according to a first clock signal, the output signal being at high level when the first clock signal is at high level;
   a resetting unit configured to reset, according to a second clock signal and a scan signal of a current stage, the output signal from high level to low level when the second clock signal and the scan signal of the current stage are simultaneously at high level, the second clock signal having a frequency twice a frequency of the first clock signal; and
   a restoring unit configured to restore, according to a scan signal of a subsequent stage, the output signal from low level to high level when the scan signal of the subsequent stage is at high level.

2. The EOA module of claim 1, wherein the high-level generating unit comprises a first N-type thin film transistor (TFT) T11, a second N-type TFT T12, and a capacitor C, wherein a gate and a drain of the first TFT T11 are both coupled with a transmission line for transmitting the first clock signal, and a source of the first TFT T11 is coupled with a gate of the second TFT T12, wherein a drain of the second TFT T12 is coupled with a transmission line for transmitting a first high-level signal, and a source of the second TFT T12 is an output of the EOA module, and wherein the capacitor is coupled between the gate of the second TFT T12 and the source of the second TFT T12.

3. The EOA module of claim 2, wherein the high-level generating unit further comprises a third N-type TFT T13, wherein a drain of the third TFT T13 is coupled with a transmission line for transmitting a second high-level signal, a gate of the third TFT T13 is coupled with the source of the second TFT T12, and a source of the third TFT T13 is coupled with the gate of the second TFT T12.

4. The EOA module of claim 3, wherein the resetting unit comprises a fourth N-type TFT T14, a fifth N-type TFT T15, and a sixth N-type TFT T16, wherein a gate of the fourth TFT T14 is coupled with a transmission line for transmitting the scan signal of the current stage, a drain of the fourth TFT T14 is coupled with a transmission line for transmitting the second clock signal, and a source of the fourth TFT T14 is coupled with a gate of the fifth TFT T15 and a gate of the sixth TFT T16, wherein a source of the fifth TFT T15 and a source of the sixth TFT T16 are coupled with a transmission line for transmitting a low-level signal, a drain of the fifth TFT T15 is coupled with the source of the second TFT T12, and a drain of the sixth TFT T16 is coupled with the source of the first TFT T11.

5. The EOA module of claim 4, wherein the restoring unit comprises a seventh N-type TFT T17, wherein a gate of the seventh TFT T17 is coupled with a transmission line for transmitting the scan signal of the subsequent stage, a drain of the seventh TFT T17 is coupled with the source of the fourth TFT T14, and a source of the seventh TFT T17 is coupled with the transmission line for transmitting the low-level signal.

6. The EOA module of claim 5, wherein the first TFT T11, the second TFT T12, and the third TFT T13 are switched on when the first clock signal is at high level.

7. The EOA module of claim 6, wherein the fourth TFT T14, the fifth TFT T15, and the sixth TFT T16 are switched on when the second clock signal is at high level.

8. The EOA module of claim 7, wherein the second TFT T12 is switched off after the sixth TFT T16 is switched on.

9. A liquid crystal display panel, comprising:
an emission D-IC on array (EOA) module disposed in a boundary area of the liquid crystal display panel and comprising:
a high-level generating unit configured to generate an output signal according to a first clock signal, the output signal being at high level when the first clock signal is at high level;
a resetting unit configured to reset, according to a second clock signal and a scan signal of a current stage, the output signal from high level to low level when the second clock signal and the scan signal of the current stage are simultaneously at high level, the second clock signal having a frequency twice a frequency of the first clock signal; and
a restoring unit configured to restore, according to a scan signal of a subsequent stage, the output signal from low level to high level when the scan signal of the subsequent stage is at high level.

10. The liquid crystal display panel of claim 9, wherein the high-level generating unit comprises a first N-type thin film transistor (TFT) T11, a second N-type TFT T12, and a capacitor C, wherein a gate and a drain of the first TFT T11 are both coupled with a transmission line for transmitting the first clock signal, and a source of the first TFT T11 is coupled with a gate of the second TFT T12, wherein a drain of the second TFT T12 is coupled with a transmission line for transmitting a first high-level signal, and a source of the second TFT T12 is an output of the EOA module, and wherein the capacitor is coupled between the gate of the second TFT T12 and the source of the second TFT T12.

11. The liquid crystal display panel of claim 10, wherein the high-level generating unit further comprises a third N-type TFT T13, wherein a drain of the third TFT T13 is coupled with a transmission line for transmitting a second high-level signal, a gate of the third TFT T13 is coupled with the source of the second TFT T12, and a source of the third TFT T13 is coupled with the gate of the second TFT T12.

12. The liquid crystal display panel of claim 11, wherein the resetting unit comprises a fourth N-type TFT T14, a fifth N-type TFT T15, and a sixth N-type TFT T16, wherein a gate of the fourth TFT T14 is coupled with a transmission line for transmitting the scan signal of the current stage, a drain of the fourth TFT T14 is coupled with a transmission line for transmitting the second clock signal, and a source of the fourth TFT T14 is coupled with a gate of the fifth TFT T15 and a gate of the sixth TFT T16, wherein a source of the fifth TFT T15 and a source of the sixth TFT T16 are coupled with a transmission line for transmitting a low-level signal, a drain of the fifth TFT T15 is coupled with the source of the second TFT T12, and a drain of the sixth TFT T16 is coupled with the source of the first TFT T11.

13. The liquid crystal display panel of claim 12, wherein the restoring unit comprises a seventh N-type TFT T17, wherein a gate of the seventh TFT T17 is coupled with a transmission line for transmitting the scan signal of the subsequent stage, a drain of the seventh TFT T17 is coupled with the source of the fourth TFT T14, and a source of the seventh TFT T17 is coupled with the transmission line for transmitting the low-level signal.

14. The liquid crystal display panel of claim 13, wherein the first TFT T11, the second TFT T12, and the third TFT T13 are switched on when the first clock signal is at high level.

15. The liquid crystal display panel of claim 14, wherein the fourth TFT T14, the fifth TFT T15, and the sixth TFT T16 are switched on when the second clock signal is at high level.

16. The liquid crystal display panel of claim 15, wherein the second TFT T12 is switched off after the sixth TFT T16 is switched on.

17. The liquid crystal display panel of claim 16, further comprising a gate D-IC on array (GOA) module, wherein the EOA module is electrically coupled with the GOA module, and the EOA module and the GOA module are both disposed in the boundary area of the liquid crystal display panel.

18. The liquid crystal display panel of claim 9, further comprising a GOA module, wherein the EOA module is electrically coupled with the GOA module, and the EOA module and the GOA module are both disposed in the boundary area of the liquid crystal display panel.

19. The liquid crystal display panel of claim 18, wherein the scan signal of the current stage and the scan signal of the subsequent stage are output by the GOA module.

* * * * *